(12) United States Patent
Jiang et al.

(10) Patent No.: US 10,825,752 B2
(45) Date of Patent: Nov. 3, 2020

(54) INTEGRATED THERMOELECTRIC COOLING

(71) Applicant: Intel Corporation, Santa Clara, CA (US)

(72) Inventors: Lei Jiang, Aloha, OR (US); Edwin B. Ramayya, Hillsboro, OR (US); Daniel Pantuso, Portland, OR (US); Rafael Rios, Austin, TX (US); Kelin J. Kuhn, Aloha, OR (US); Seiyon Kim, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 267 days.

(21) Appl. No.: 14/775,487

(22) PCT Filed: Jun. 18, 2013

(86) PCT No.: PCT/US2013/046400
§ 371 (c)(1),
(2) Date: Sep. 11, 2015

(87) PCT Pub. No.: WO2014/204447
PCT Pub. Date: Dec. 24, 2014

(65) Prior Publication Data
US 2016/0027717 A1 Jan. 28, 2016

(51) Int. Cl.
*H01L 23/38* (2006.01)
*H01L 21/8238* (2006.01)
(Continued)

(52) U.S. Cl.
CPC .......... *H01L 23/38* (2013.01); *H01L 21/8238* (2013.01); *H01L 27/092* (2013.01);
(Continued)

(58) Field of Classification Search
None
See application file for complete search history.

(56) References Cited

U.S. PATENT DOCUMENTS 5,895,964 A * 4/1999 Nakayama ............. H01L 23/38
257/577
6,466,441 B1 10/2002 Suzuki
(Continued)

FOREIGN PATENT DOCUMENTS

| CN | 100592541 C | 2/2010 |
|---|---|---|
| GB | 2364439 A | 1/2002 |
| JP | 2004532513 A | 10/2004 |

OTHER PUBLICATIONS

International Preliminary Report on Patentability dated Dec. 30, 2015, issued in corresponding International Application No. PCT/US2013/046400, filed Jun. 18, 2013, 10 pages.
(Continued)

*Primary Examiner* — Robert K Carpenter
(74) *Attorney, Agent, or Firm* — Schwabe, Williamson & Wyatt, P.C.

(57) ABSTRACT

Embodiments of the present disclosure describe techniques and configurations for integrated thermoelectric cooling. In one embodiment, a cooling assembly includes a semiconductor substrate, first circuitry disposed on the semiconductor substrate and configured to generate heat when in operation and second circuitry disposed on the semiconductor substrate and configured to remove the heat by thermoelectric cooling. Other embodiments may be described and/or claimed.

14 Claims, 6 Drawing Sheets

(51) Int. Cl.
*H01L 27/092* (2006.01)
*H05K 1/18* (2006.01)

(52) U.S. Cl.
CPC .... *H05K 1/181* (2013.01); *H01L 2224/16225* (2013.01); *H01L 2924/15311* (2013.01); *H05K 2201/10166* (2013.01)

(56) References Cited

U.S. PATENT DOCUMENTS

| | | | | |
|---|---|---|---|---|
| 6,614,109 | B2* | 9/2003 | Cordes | H01L 23/38 136/203 |
| 6,774,450 | B2* | 8/2004 | Inbe | H01L 23/38 136/201 |
| 6,800,933 | B1* | 10/2004 | Mathews | H01L 23/38 257/467 |
| 6,981,380 | B2* | 1/2006 | Chrysler | F25B 21/02 257/E23.082 |
| 7,299,639 | B2* | 11/2007 | Leija | H01L 23/38 257/E23.082 |
| 7,893,529 | B2* | 2/2011 | Hsu | H01L 23/481 136/203 |
| 8,026,567 | B2* | 9/2011 | Chang | H01L 23/38 136/201 |
| 8,264,055 | B2* | 9/2012 | Edwards | H01L 21/823814 257/469 |
| 8,686,277 | B2* | 4/2014 | Farahani | H01L 23/38 136/201 |
| 2003/0057511 | A1* | 3/2003 | Inbe | H01L 23/38 257/467 |
| 2004/0118129 | A1 | 6/2004 | Chrysler et al. | |
| 2006/0048809 | A1 | 3/2006 | Onvural | |
| 2006/0102223 | A1* | 5/2006 | Chen | H01L 23/38 136/201 |
| 2009/0173976 | A1* | 7/2009 | Augusto | H01L 27/14669 257/292 |
| 2010/0085713 | A1 | 4/2010 | Balandin et al. | |
| 2010/0164093 | A1 | 7/2010 | Mowry et al. | |
| 2011/0006388 | A1* | 1/2011 | Kawanaka | H01L 23/38 257/467 |
| 2011/0233512 | A1* | 9/2011 | Yang | B82Y 10/00 257/9 |
| 2012/0152296 | A1* | 6/2012 | Jang | H01L 35/52 136/200 |
| 2012/0153454 | A1* | 6/2012 | Liu | H01L 23/38 257/712 |
| 2012/0291832 | A1 | 11/2012 | Okuda et al. | |
| 2013/0001655 | A1* | 1/2013 | Huang | H01L 23/38 257/256 |
| 2013/0015549 | A1* | 1/2013 | Fornara | H01L 23/5226 257/467 |

OTHER PUBLICATIONS

TW Office Action and Search Report dated Mar. 16, 2016, issued in corresponding Taiwan Patent Application No. 103117902.
International Search Report and Written Opinion dated Mar. 25, 2015, issued in corresponding International Application No. PCT/US2013/046400, filed Jun. 18, 2013, 14 pages.
Office Action dated Aug. 15, 2018 for UK Patent Application No. GB1520165.0, 3 pages.
Office Action dated Jan. 5, 2018 for UK Patent Application No. GB1520165.0, 3 pages.
Office Action dated Oct. 30, 2019 for Korean Paten Application No. 10-2015-7030571, 9 pages.
Office Action dated Feb. 10, 2020 for Korean Paten Application No. 10-2015-7030571, 6 pages.
Office Action dated Jul. 4, 2020 for Korean Paten Application No. 10-2015-7030571, 7 pages.

* cited by examiner

INTEGRATED THERMOELECTRIC COOLING

CROSS REFERENCE TO RELATED APPLICATIONS

The present application is a national phase entry under 35 U.S.C. § 371 of International Application No. PCT/US2013/046400, filed Jun. 18, 2013, entitled "INTEGRATED THERMOELECTRIC COOLING", which designated, among the various States, the United States of America. The Specification of the PCT/US2013/046400 Application is hereby incorporated by reference.

FIELD

Embodiments of the present disclosure generally relate to the field of integrated circuits, and more particularly, to techniques and configurations for integrated thermoelectric cooling.

BACKGROUND

Localized heating of circuitry (e.g., transistors) formed on dies is challenging the limits of present heat removal technologies, particularly as technology for such circuitry adopts newer architectures such as, for example, fin-based technologies such as tri-gate transistor devices, quantum wells, nanowire-based transistors and the like. In these technologies, fin structures or analogous structures may be composed of semiconductor materials that serve as channels of transistors. A taller and narrower profile of the fin structures may desirably increase device performance. Additionally, each fin or device may be electrically insulated with a dielectric material, which may thermally insulate the fin structures.

As the fin structures continue to scale to smaller dimensions (e.g., fin width less than 10 nanometers) to provide smaller dies with greater performance, a thermal conductivity of the semiconductor material of the fin structures may degrade due to phonon scattering. Thus, the heat generated with each transistor operation may be limited to a small volume in the channel region (e.g., under the gate) and may ineffectively dissipate by thermal conduction along the thin fin to bulk material (e.g., bulk silicon of a semiconductor substrate) or through gate or source/drain contact metals. In these cases, highly localized heat sometimes referred to as "hot spots" may be observed in the channel region, which may adversely affect device and/or interconnect reliability.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
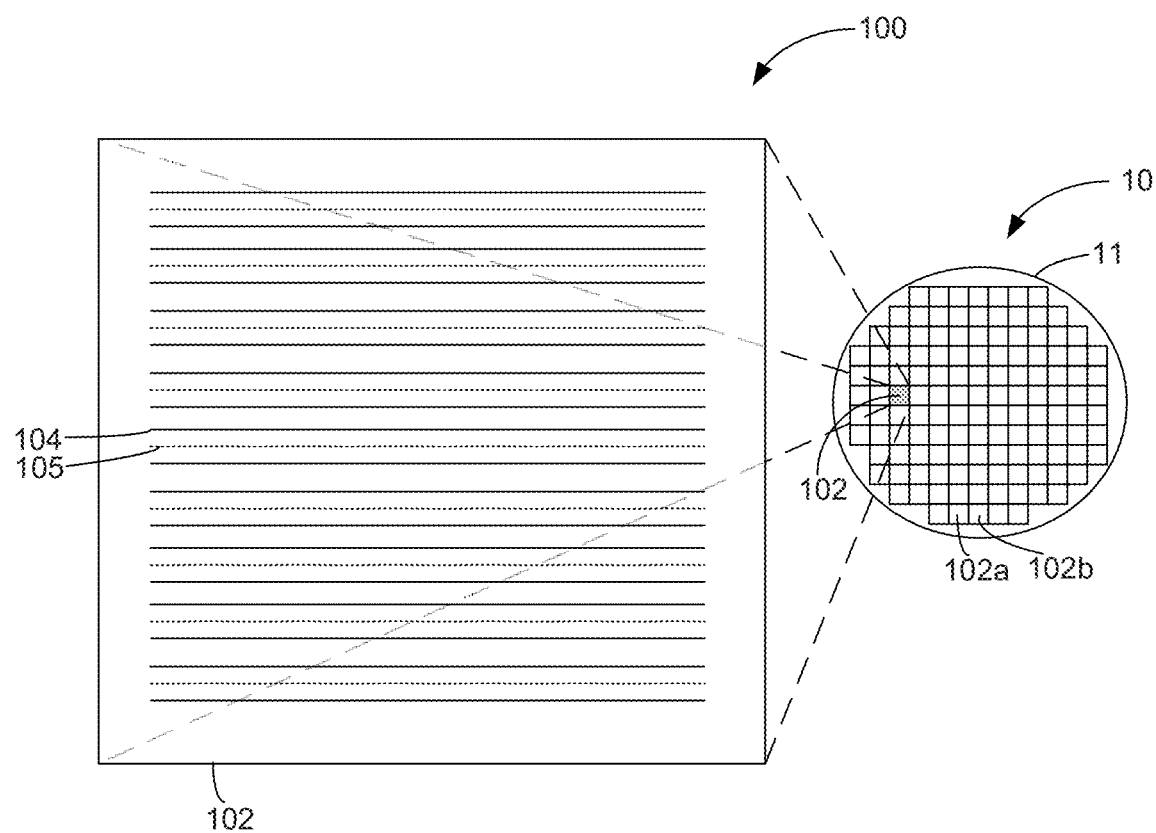
FIG. 1 schematically illustrates a top view of an example die in wafer form and in singulated form, in accordance with some embodiments.

Embodiments of the present disclosure describe techniques and configurations for integrated thermoelectric cooling. For example, thermoelectric cooling circuitry may be integrally formed with transistor circuitry or other heat-generating circuitry of a die, according to various embodiments. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 102a, 102b) of a wafer 11 composed of semiconductor material such as, for example silicon or other suitable material. The plurality of dies may be formed on a surface of the wafer 11. Each of the dies may be a repeating unit of a semiconductor product that includes heat-generating circuitry and thermoelectric cooling (TEC) circuitry as described herein.

The heat-generating circuitry may include any suitable circuitry that is configured to generate heat when in operation including, for example, transistors and the like. The heat-generating circuitry may be formed using transistor elements 104 as described herein such as, for example, fin structures, quantum wells (QWs), nanowires or planar structures that may be used to form channel bodies of the transistors. The TEC circuitry may include TEC elements 105 that are formed using analogous techniques and structures as the transistor elements 104 or in accordance with other embodiments described herein. The heat-generating circuitry and the TEC circuitry may be independently controlled by a control module or respective control modules disposed on the die 102 or disposed on another component of an IC package (e.g., IC package 200 of FIG. 2) coupled with the die 102. For example, the TEC circuitry may be controlled to provide periodic or intermittent cooling or cooling according to any other predetermined criteria.

Although the transistor elements 104 and TEC elements 105 are depicted in rows that traverse a substantial portion of the die 102 in FIG. 1, subject matter is not limited in this regard, and any other suitable arrangement of the transistor elements 104 and TEC elements 105 on the die 102 may be used according to various embodiments.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the transistor elements 104 and/or TEC elements 105 may be disposed on a semiconductor substrate in wafer form 10 or singulated form 100. Transistor elements 104 and/or TEC elements 105 described herein may be incorporated in a die 102 for logic or memory, or combinations thereof. In some embodiments, the transistor elements 104 and/or TEC elements 105 may be part of a system-on-chip (SoC) assembly.

Figure 2:
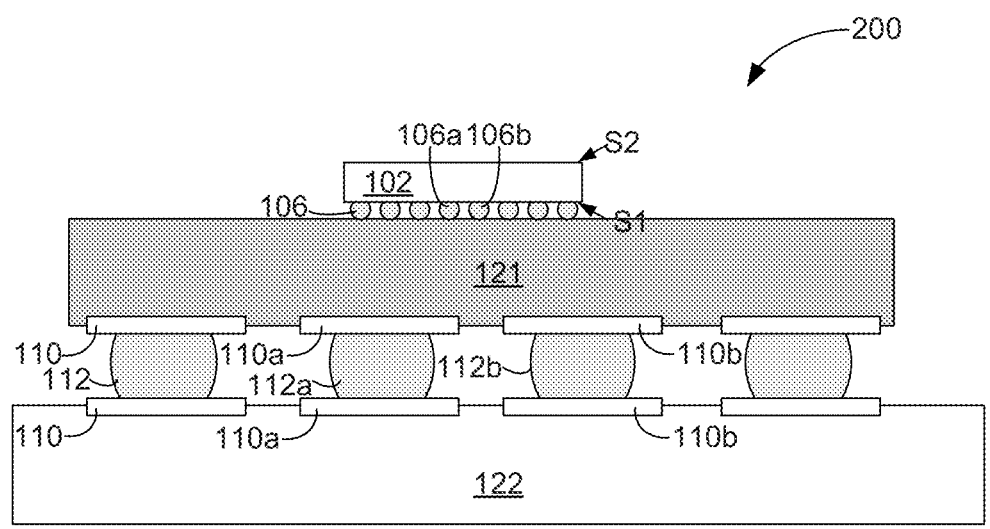
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. The die 102 may include heat-generating circuitry and TEC circuitry as described herein. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC in some embodiments. In some embodiments, an electrically insulative material such as, for example, molding compound or underfill material (not shown) may encapsulate at least a portion of the die 102 and/or interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including heat-generating circuitry is attached to a surface of the package substrate 121 using die-level interconnect structures 106 such as bumps, pillars, or other suitable structures that may also electrically couple the die 102 with the package substrate 121. The active side S1 of the die 102 may include heat-generating circuitry such as, for example, transistor devices and TEC circuitry. An inactive side, S2, may be disposed opposite to the active side S1, as can be seen.

In some embodiments, the die-level interconnect structures 106 may be configured to route electrical signals between the dies. The electrical signals may include, for example, input/output (I/O) signals and/or power/ground signals that are used in connection with operation of the die. In one embodiment, the die-level interconnects may include a first interconnect 106a configured to route first electrical energy (e.g., a first voltage) for operation of the heat-generating circuitry and a second interconnect 106b configured to route second electrical energy (e.g., a second voltage) for operation of the TEC circuitry. The first interconnect 106a may be coupled with a corresponding first interconnect structure (not shown) formed on the active side S1 of the die 102 to electrically couple the first interconnect 106a with the heat-generating circuitry and the second interconnect 106b may be coupled with a corresponding second interconnect structure (not shown) formed on the active side S1 of the die 102 to electrically couple the second interconnect 106b with the TEC circuitry. The corresponding first interconnect structure and second interconnect structure may include, for example, pads, vias, trenches, traces and/or contacts formed on the active side S1 of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106, 106a, 106b of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1102 of FIG. 11).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. In some embodiments, one or more first pads 110a may be configured to route the electrical signals routed by first interconnect 106a through solder ball 112a and one or more second pads 110b may be configured to route the electrical signals routed by second interconnect 106b through solder ball 112b. Other suitable techniques to physically and/or electrically couple the package substrate 121 with the circuit board 122 may be used in other embodiments.

The IC assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 100 may be used in some embodiments.

Figure 3:
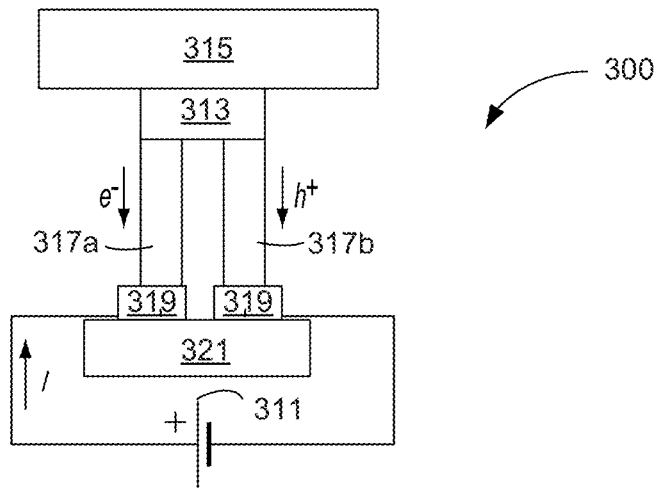
FIG. 3 schematically illustrates a thermoelectric cooling (TEC) device, in accordance with some embodiments.

FIG. 3 schematically illustrates a thermoelectric cooling (TEC) device 300, in accordance with some embodiments. The TEC circuitry on the die 102 may include on or more TEC devices that operate according to the principles described in connection with the TEC device 300.

In the TEC device 300, an active electric current, I, provided by source 311 may be used as a carrier to remove heat. The TEC device 300 may use TEC cooling based on the Peltier effect to provide Peltier cooling. Peltier cooling may be accomplished when the active electric current I is applied to a contact 313 composed of metal or other highly electrically conductive material disposed between an object 315 to be cooled and a semiconductor, which may include n-type semiconductor 317a and/or p-type semiconductor 317b. In n-type semiconductor 317a, electrons may serve as carriers to remove heat away from the object 315 to be cooled towards a heat sink and, in p-type semiconductor 317b, holes may serve as carriers to remove heat away from the object 315 to be cooled towards a contact 319 composed of metal or other highly electrically conductive material with low Seebeck coefficient in thermal contact with a heat sink 321. The carriers (e.g., electrons or holes) may carry different amounts of heat in different materials as represented by a Seebeck coefficient (S). The abrupt change of Seebeck coefficient at the metallic junction of the contact 313 between the object 315 to be cooled and the semiconductor (e.g., 317a and/or 317b) results in heat removal at the interface and heat generation at the opposite end at the metallic junction of the contact 319 between the semiconductor (e.g., 317a and/or 317b) and the heat sink 321.

Equation (1) defines heat flux of the TEC device 300 where $Q_C$ is heat flux at the contact interface with semiconductor material, S is the Seebeck coefficient of the semiconductor material, I is the current, $T_C$ is temperature at the contact interface, K is thermal conductance of the semiconductor material, $\Delta T$ is a thermal gradient across the thermoelectric element (e.g., material between contacts 313 and 319) and R is electrical resistance of the semiconductor 317a and/or 317b.

$$Q_C = SIT_C - K\Delta T - \frac{1}{2}I^2R \quad (1)$$

The $SIT_C$ term of Equation (1) may represent a thermoelectric effect or "cooling," the $K\Delta T$ term may represent a thermal conduction effect and the $$\frac{1}{2}I^2R$$

may represent a Joule heating effect in the TEC device 300. Thus, cooling effectiveness of the TEC device 300 may be limited by joule heating through the TEC device 300. For better efficiency, a material of the semiconductor 317a and/or 317b may be selected with a high Seebeck coefficient S and a lower resistance R.

In some embodiments, the Seebeck coefficient may not be constant in temperature resulting in a gradient in the Seebeck coefficient. A related effect of the Peltier effect is the Thomson effect where a continuous Peltier effect may occur if a current is driven through the gradient. The TEC device 300 and/or TEC circuitry described herein may cool according to the Peltier effect and/or Thomson effect according to various embodiments.

Figure 4:
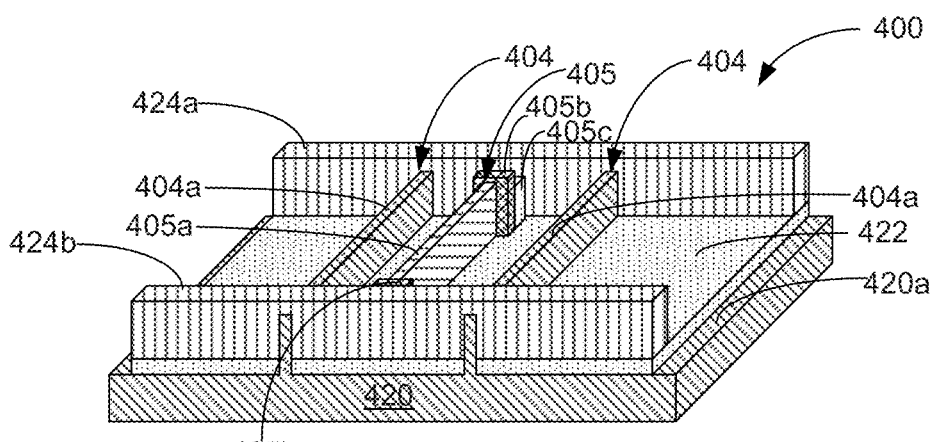
FIG. 4 schematically illustrates a cross-section perspective view of an example configuration for heat-generating circuitry and TEC circuitry on a semiconductor substrate, in accordance with some embodiments.

FIG. 4 schematically illustrates a cross-section perspective view of an example configuration 400 (e.g., an IC cooling assembly) for heat-generating circuitry 404 and TEC circuitry 405 on a semiconductor substrate 420, in accordance with some embodiments. The TEC circuitry 405 may comport with embodiments described in connection with the TEC device 300 of FIG. 3. The configuration 400 may represent only a portion of the heat-generating circuitry 404 and TEC circuitry 405 formed on an active side (e.g., active side S1 of FIG. 1) of a die.

The semiconductor substrate 420 may be composed of a semiconductor material such as, for example, silicon or any other suitable semiconductor material including, for example, germanium, silicon germanium, group III-V materials or group II-VI materials, or combinations thereof. One or more fin structures (hereinafter "fin structures 404a") of the heat-generating circuitry 404 may be formed on the semiconductor substrate 420. Each of the fin structures 404a may be configured to serve as a channel of one or more transistor devices such as, for example, a tri-gate or other finFET (field effect transistor) device.

In some embodiments, the fin structures 404a may be formed from material of the semiconductor substrate 420. One or more fin structures (hereinafter "fin structure 405a") of the TEC circuitry 405 may be simultaneously formed on the semiconductor substrate 420 with the fin structures 404a. For example, the semiconductor substrate 420 may be patterned using lithography and/or etch processes to remove material of the semiconductor substrate 420 to form the fin structures 404a and 405a. In one embodiment, the fin structures 404a and 405a are composed of a same semiconductor material as the semiconductor substrate 420. In other embodiments, the fin structures 404a and 405a may be composed of a suitable semiconductor material that is chemically different than the semiconductor material of the semiconductor substrate 420.

In the depicted embodiment, the fin structures 404a and 405a are disposed in a horizontal plane that is substantially parallel with a plane defined by a surface 420a of the semiconductor substrate 420. That is, the fin structures 404a and 405a occupy a same active device layer formed on the semiconductor substrate 420, as can be seen. The fin structures 404a and 405a extend in a lengthwise direction such that the fin structures 404a and 405a are substantially parallel with one another. According to various embodiments, the fin structure 405a is configured to remove heat in the lengthwise direction. In the depicted embodiment, the fin structure 405a is disposed between two of the fin structures 404a. In some embodiments, the fin structures 404a, 405a may be formed using a regular pitch or half-pitch process, or combinations thereof, or other pitch reduction techniques. The fin structures 404a and 405a may be arranged in any other suitable configuration relative to one another in other embodiments.

An electrically insulative material 422 may be deposited on the semiconductor substrate between the fin structures 404a, 405a, as can be seen. The electrically insulative material 422 may include, for example, a dielectric material such as silicon oxide (e.g., $SiO_2$) or analogous material to provide shallow trench isolation (STI).

The fin structures 404a of the heat-generating circuitry 404 may be electrically coupled with a voltage source (e.g., first voltage source) and the fin structure 405a of the TEC circuitry 405 may be electrically coupled with another voltage source (e.g., second voltage source). The first voltage source and the second voltage source may be independently controlled in some embodiments. For example, a first voltage of the first voltage source may be used for operation of transistors of a die (e.g., to apply a threshold voltage to a gate of a transistor) and a second voltage of the second voltage source may be used for cooling and/or power needs of the die (e.g., to remove heat by thermo-electric cooling). Although the first voltage and second voltage may serve different functions as described, the first voltage and second voltage may have a same or similar voltage, in some embodiments. The first voltage source and the second voltage source may be disposed in any of a variety of suitable locations including, for example, on an active side S1 or inactive side S2 the die 102 including the heat-generating circuitry 404, on a package substrate (e.g., package substrate 121 of FIG. 2), on a circuit board 122 (e.g., circuit board 122 of FIG. 2) or suitable combinations thereof. In some embodiments, the voltage source(s) of the TEC circuitry may co-exist with the voltage source(s) for the heat generating circuitry.

The fin structures 404a of the heat-generating circuitry 404 may be electrically coupled with the first voltage source using one or more first interconnect structures. For example, the first interconnect structures may include electrodes 424a, 424b that serve as gate or source/drain contacts of the heat-generating circuitry 404. The first interconnect structures may further include additional circuitry such as, for example, trenches, vias, pads, and/or die-level interconnect structures (e.g., first interconnect 106a of FIG. 1) and the like to further route the first voltage from the first voltage source to the fin structures 404a.

The fin structure 405a of the heat-generating circuitry 404 may be electrically coupled with the second voltage source using one or more second interconnect structures. For example, the second interconnect structures may include TEC contacts 405b that serve as gate or source/drain contacts of the heat-generating circuitry 404. The second interconnect structures may further include additional circuitry such as, for example, trenches, vias, pads, and/or die-level interconnect structures (e.g., second interconnect 106b of FIG. 1) and the like to further route the second voltage from the second voltage source to the fin structure 405a.

According to various embodiments, the fin structures 404a of the heat-generating circuitry 404 are thermally coupled with the fin structure 405a of the TEC circuitry 405. For example, electrodes 424a, 424b that are composed of a highly electrically conductive material such as metal may be thermally coupled with at least one of the fin structures 404a and the fin structure 405a. The electrodes 424a, 424b may include or be, for example, gate and/or source/drain contacts or terminals. In one embodiment, the electrode 424a represents a contact that is hotter relative to electrode 424b (e.g., electrode 424b is cooler and operates as a heat sink for electrode 424a).

Other materials or layers may intervene between the material of the electrodes 424a, 424b and the material of the fin structures 404a, 405a. For example, in the depicted embodiment, the TEC circuitry 405 may further include an electrical insulator 405c disposed between the electrodes 424a, 424b and the fin structure 405a. The electrical insulator 405c may include, for example, a material that is electrically insulative and thermally conductive. In this regard, the electrical insulator 405c may provide electrical insulation to prevent shorting and/or current leakage between the TEC circuitry 405 and the heat-generating circuitry 404 while providing a thermal pathway or part of a thermal pathway between the electrodes 424a, 424b and the fin structure 405a. For example, the electrical insulator 405c may be composed of a material such as silicon carbide silicon nitride, aluminum nitride, boron nitride and the like, or other suitable material.

The electrical insulator 405c may be in direct contact with the TEC contacts 405b and/or the fin structure 405a. The TEC contacts 405b may wrap around the fin structure 405a and/or abut an end of the fin structure 405a, according to various embodiments. An electrical insulator (not shown) may be similarly configured between electrode 424b and the fin structure 405a as depicted for electrical insulator 405c between electrode 424a and the fin structure 405a. In the depicted embodiment, the fin structure 405a of the TEC circuitry 405 terminate within a region between electrodes 424a, 424b, while fin structures 404a of the heat-generating circuitry 404 may pass through the electrodes 424a, 424b.

Material of the fin structures 404a, 405a may be doped with impurities to provide n-type or p-type fin structures 404a, 405a. In some embodiments, the fin structures 404a, 405a may both be n-type or may both be p-type. For example, as depicted in FIG. 4, the fin structure 405a may not be electrically coupled with a same electrode (e.g., electrodes 424a, 424b) as the fin structures 404a and may instead be electrically coupled with independent contacts (e.g., TEC contacts 405b) for operation. In such embodiment where the fin structure 405a is doped with a same type of impurity (e.g., n-type or p-type), a polarity of a voltage applied to the fin structure 405a may be opposite to a polarity of a voltage applied to the fin structures 404a to facilitate heat removal.

In other embodiments, the fin structure 405a of the TEC circuitry 405 may have an opposite type of doping (e.g., n-type or p-type) than the fin structures 404a of the heat-generating circuitry 404. For example, in one embodiment, the fin structures 404a may be n-type and the fin structure 405a may be p-type. In another embodiment, the fin structures 404a may be p-type and the fin structure 405a may be n-type. According to various embodiments, the TEC circuitry 405 may be designed or arranged relative to the heat-generating circuitry 404 such that the carriers (e.g., holes or electrons) move in an opposite direction in the TEC circuitry 405 relative to carriers (e.g., holes or electrons) in the heat-generating circuitry.

Various features of the heat-generating circuitry 404 may be omitted for the sake of clarity. For example, in an embodiment where the electrodes 424a, 424b represent gate electrodes, a gate dielectric material may be disposed between the fin structures 404a and the electrodes 424a, 424b. Although the configuration 400 depicts features having rectangular profiles, according to various embodiments, the features (e.g., fin structures 404a, 405a) of the configuration 400 may include arcuate, curved profiles consistent with patterning processes used to form the fin structures. The profile of features in configuration 400 may have other shapes or configurations consistent with well-known semiconductor fabrication techniques in other embodiments.

Figure 5:
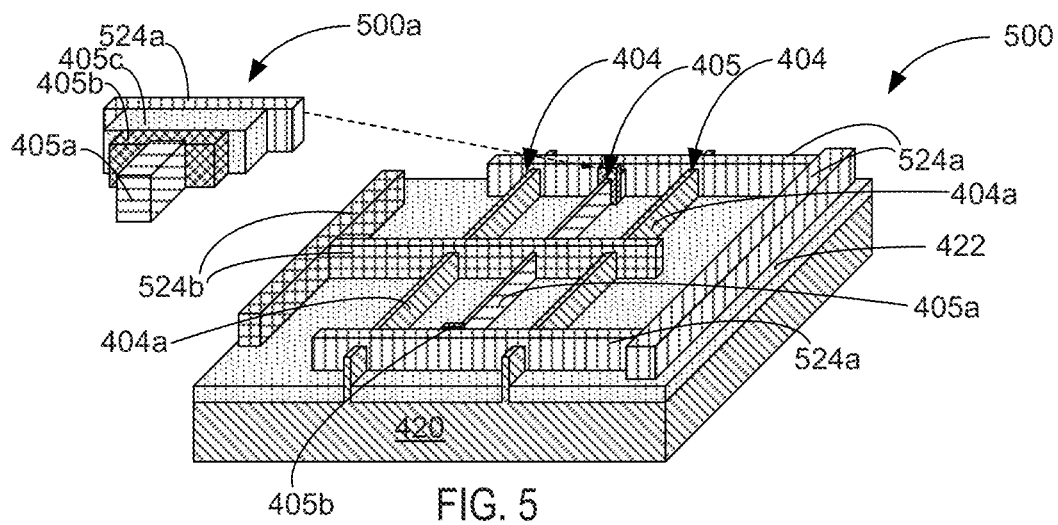
FIG. 5 schematically illustrates a cross-section perspective view of another example configuration for heat-generating circuitry and TEC circuitry on a semiconductor substrate, in accordance with some embodiments.

FIG. 5 schematically illustrates a cross-section perspective view of another example configuration 500 (e.g., an IC cooling assembly) for heat-generating circuitry 404 and TEC circuitry 405 on a semiconductor substrate 420, in accordance with some embodiments. The configuration 500 may include components of heat-generating circuitry 404 and TEC circuitry 405 that comport with embodiments described in connection with configuration 400 in FIG. 4.

In the configuration 500, electrodes 524a may be electrically coupled with fin structures 404a and serve as a source contact of the heat-generating circuitry 404. Electrodes 524b may also be electrically coupled with fin structures 404a and serve as a drain contact of the heat-generating circuitry 404. In some embodiments, the drain contact (e.g., electrodes 524b in the depicted embodiments) may be hotter than the source and gate, particularly at or near a saturation state of current (Idsat). The electrodes 524b may further be thermally and electrically coupled with fin structure 405a and serve as a source contact of the TEC circuitry 405, as can be seen. The TEC contacts 405b may serve as a drain contact of the TEC circuitry 405. In other embodiments, the source and drain functions described above may be switched. Similar principles as described in connection with the configuration 500 may be used to provide a configuration to cool a source contact or gate contact of the heat-generating circuitry 404.

According to various embodiments, an interface 500a between the fin structure 405a of the TEC circuitry 405 and the electrodes 524a may include a TEC contact 405b electrically coupled with the fin structure 405 and a thermal insulator 405c thermally coupled with the electrodes 524a and the fin structure 405a, as can be seen in the magnified view of a portion of the configuration 500 indicated by the dashed arrow in FIG. 5.

Thermal conduction properties of semiconductor materials (e.g., silicon) may degrade at smaller dimensions. For example, thermal conduction may degrade more than 20 times for thin transistor elements (e.g., a fin structure having a thickness less than 10 nm in horizontal direction perpendicular to lengthwise direction of fin structure) while maintaining sufficient electrical properties for operation due to doping, which may result in excessive self-heat of a transistor device. The poor thermal conduction of such fin structures (or nanowire structures) may be mitigated by thermoelectric cooling to move thermal carriers from a hotter region to a cooler region using an electrical field. In the configurations described herein, the TEC circuitry 405 can be integrally positioned at local hot spots where device self-heat problems exist or are predicted to exist according to model or design in the heat-generating circuitry 404 to mitigate localized heating. As fin structures 404a continue to scale to smaller dimensions in future technologies, worsening thermal conductivity may increase importance and reliance on TEC circuitry 405 to remove heat by non-conductive means.

Figure 6:
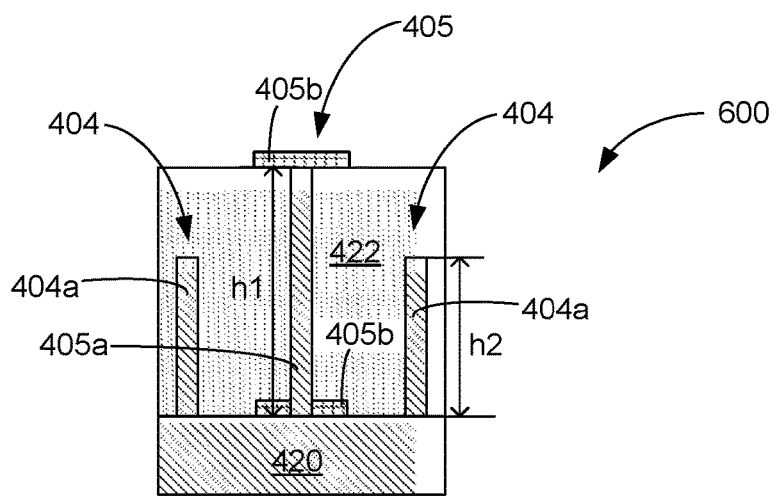
FIG. 6 schematically illustrates a cross-section view of another example configuration for heat-generating circuitry and TEC circuitry on a semiconductor substrate, in accordance with some embodiments.

FIG. 6 schematically illustrates a cross-section view of another example configuration 600 (e.g., an IC cooling assembly) for heat-generating circuitry 404 and TEC circuitry 405 on a semiconductor substrate 420, in accordance with some embodiments. In the configuration 600, TEC contacts 405b may be disposed at opposing ends of the fin structure 405a of the TEC circuitry 405, as can be seen, to facilitate heat removal in the vertical direction using thermoelectric cooling principles described herein.

In the configuration 600, the fin structure 405a of the TEC circuitry 405 extends in a vertical direction that is substantially perpendicular to a lengthwise direction of the fin structure 405a to define a height, h1. In some embodiments, the fin structures 404a may have a height, h2, that is smaller than the height h1. The height h1 of the fin structure 405a may be configured to remove heat in the vertical direction to a layer (e.g., an interconnect layer such as, for example, a metal trench or via layer) disposed on the fin structures 404a of the heat-generating circuitry 404.

Figure 7:
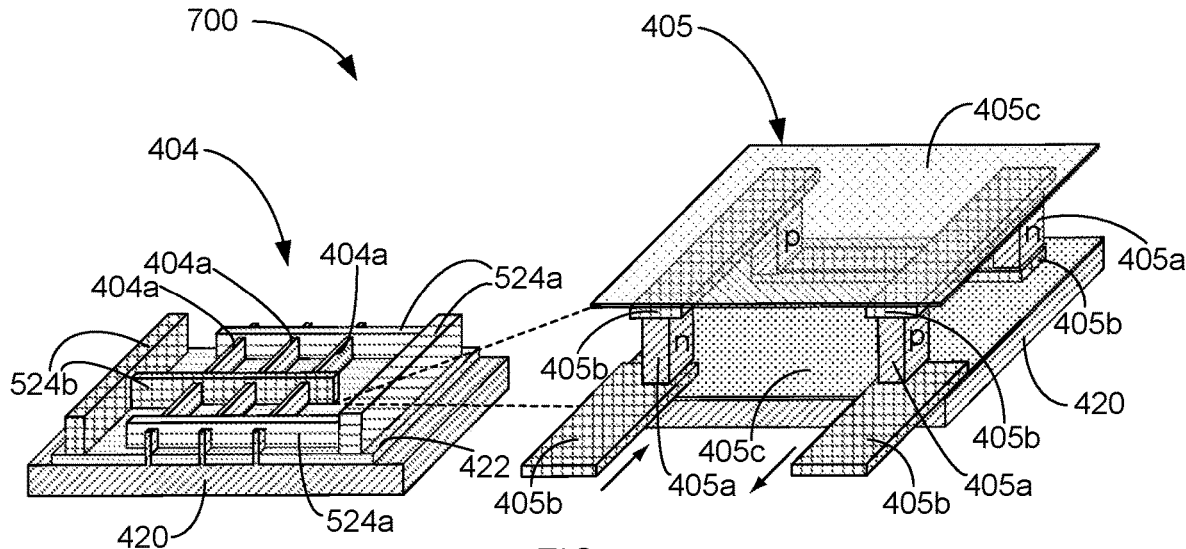
FIG. 7 schematically illustrates a cross-section perspective view of another example configuration for heat-generating circuitry and TEC circuitry on a semiconductor substrate, in accordance with some embodiments.

FIG. 7 schematically illustrates a cross-section perspective view of another example configuration 700 (e.g., an IC cooling assembly) for heat-generating circuitry 404 and TEC circuitry 405 on a semiconductor substrate 420, in accordance with some embodiments. In the configuration 700, the TEC circuitry 405 is disposed between the heat-generating circuitry 404 and the semiconductor substrate 420. In the depicted embodiment, a portion of the TEC circuitry 405 is depicted in enlarged form. The TEC circuitry 405 may be disposed under the fin structures 404a as indicated by the dashed lines or under other components of the heat-generating circuitry 404 such as electrodes 524a, 524b.

The TEC circuitry 405 may include TEC contacts 405b coupled with opposing ends of fin structures 405a, as can be seen. In the depicted embodiment, the fin structures 405a are configured as pillars connected in a series of n-type and p-type elements to route heat in the vertical direction (e.g., away from the overlying heat-generating circuitry 404 towards the semiconductor substrate 420, which may serve as a heat sink) when a current I or load is applied. For example, the top TEC contacts 405b may be thermally coupled with the fin structures 404a or electrodes 524a, 524b of the heat-generating circuitry 404 through a top electrical insulator 405c layer, which may electrically insulate the TEC contacts 405b from the heat-generating circuitry 404 while still allowing thermal conduction through the electrical insulator 405c. Bottom TEC contacts 405b may be similarly electrically insulated from the semiconductor substrate 420 by a bottom electrical insulator 405c layer. The top electrical insulator 405c layer may be depicted as partially transparent to avoid obscuring underlying features.

In some embodiments, a region between the electrical insulator 405c layers is not depicted to avoid obscuring features of the TEC circuitry 405. Such region may be substantially filled with an electrically insulative material in some embodiments including, for example, silicon carbide, silicon nitride or silicon oxide. The fin structures 405a may include other suitable shapes and/or configurations. For example, the n-type and p-type doping may be switched for the fin structures 405a in some embodiments. A larger number of n-type and p-type elements may increase thermoelectric cooling efficiency of the TEC circuitry 405. In some embodiments, the fin structures 405a and/or TEC contacts 405b may be generally referred to as thermal routing structures. In some embodiments, the configuration 700 may be amenable or well-suited for integration with three-dimensional (3D) stacking processes such as, for example, wafer-to-wafer bonding in which the TEC circuitry 405 may be located under a region where heat-generating circuitry 404 may be expected to overheat.

Figure 8:
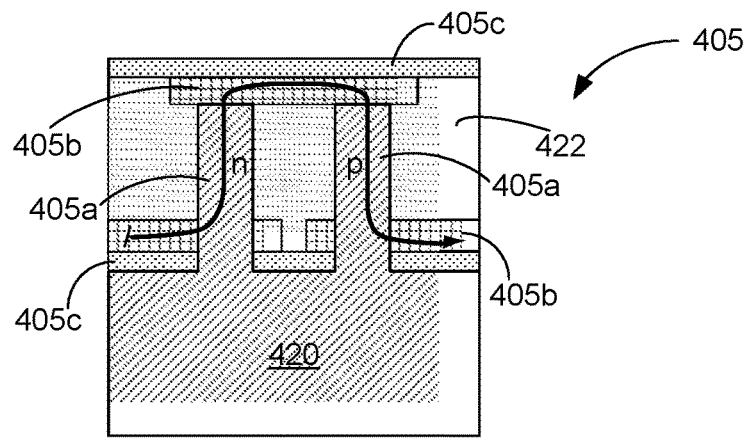
FIG. 8 schematically illustrates a cross-section view of the example configuration for the TEC circuitry of FIG. 7, in accordance with some embodiments.

FIG. 8 schematically illustrates a cross-section view of the example configuration 700 (e.g., an IC cooling assembly) for the TEC circuitry 405 of FIG. 7, in accordance with some embodiments. On application of a current I (indicated by path of arrow) or load, heat from an upper TEC contact 405b may be removed to a lower TEC contact 405b through n-type and p-type fin structures 405a, as can be seen. In some embodiments, an electrically insulative material 422 may be disposed between the electrical insulator 405c layers.

Figure 9:
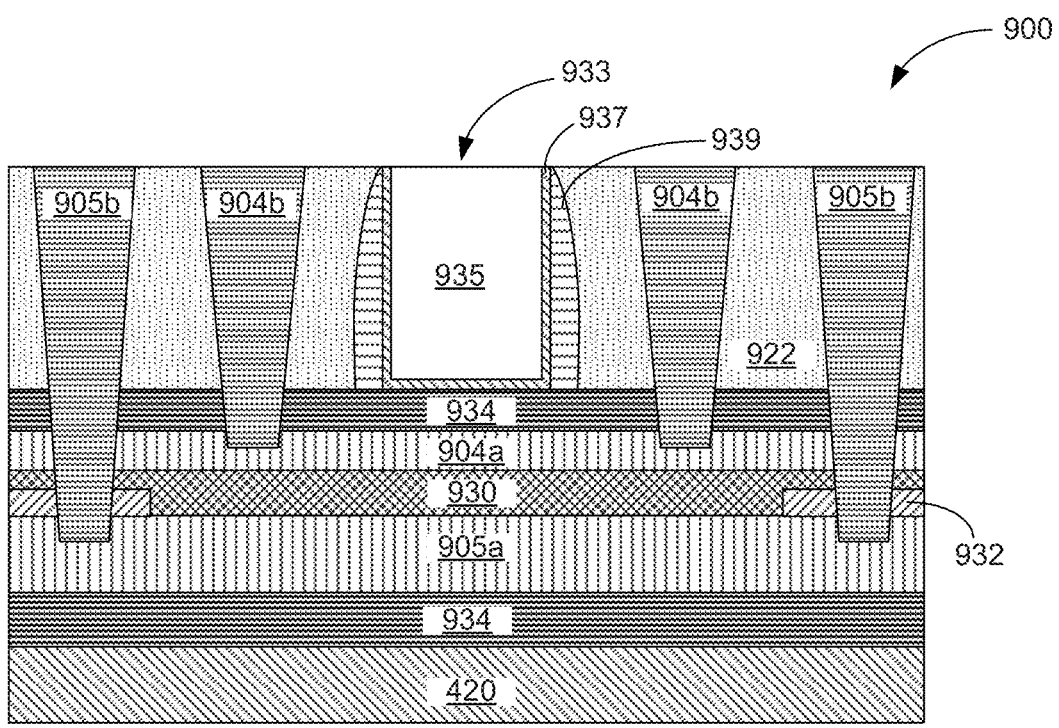
FIG. 9 schematically illustrates a cross-section view of another example configuration for heat-generating circuitry and TEC circuitry on a semiconductor substrate, in accordance with some embodiments.

FIG. 9 schematically illustrates a cross-section view of another example configuration 900 (e.g., an IC cooling assembly) for heat-generating circuitry and TEC circuitry on a semiconductor substrate 420, in accordance with some embodiments. In the configuration 900, the heat-generating circuitry may include one or more nanowires (hereinafter "nanowire 904a") coupled with a corresponding voltage source (e.g., first voltage source) through electrodes 904b, which may serve as source/drain contacts of a switching device (e.g., transistor 933) in the depicted embodiment. For example, the nanowire 904a may serve as a channel for mobile charge carriers in the transistor 933 and may thus be referred to as an "active nanowire." In the configuration 900, the TEC circuitry may include one or more nanowires (hereinafter "nanowire 905a") coupled with a corresponding TEC voltage source (e.g., second voltage source) through electrodes 905b, which may serve as source/drain contacts of the TEC circuitry. When the TEC circuitry is in operation, the nanowire 905a may route heat in a horizontal direction (e.g., in a lengthwise direction of the nanowire 905a).

The nanowires 904a, 905a may be thermally and electrically coupled by electrodes 905b and may be separated by electrically insulative material 930. The electrically insulative material 930 may include a dielectric such as, for example, silicon carbide, silicon oxide or silicon nitride. The electrically insulative material 930 may be thermally conductive to facilitate heat transfer from the channel (e.g., nanowire 904a) of the transistor 933 to the TEC element (e.g., nanowire 905a). For example, the electrically insulative material 930 may include a thermally conductive material such as silicon carbide or a more thermally insulative material such as silicon oxide where a thickness of the more thermally insulative material is designed, selected or otherwise controlled to increase, allow or facilitate thermal conduction through the electrically insulative material 930. An epitaxial material (referred to as "epi") or silicide 932 may be disposed at an interface between the electrodes 905b and the nanowire 905a to increase thermal and/or electrical contact between the electrodes 905b and the nanowire 905a. Electrically insulative material 934 may be disposed to encapsulate at least the active nanowire. In the depicted embodiment, the electrically insulative material 934 is disposed to encapsulate the nanowires 904a, 905a. The electrically insulative material 934 may include a dielectric such as, for example silicon oxide or silicon nitride.

The nanowires 904a, 905a may be in a stacked configuration and may include more nanowires than depicted in some embodiments. The nanowires may be composed of any suitable material including, for example, silicon, carbon or other suitable materials for semiconductor applications. The electrodes 904b, 905b may be composed of any suitable electrically conductive material including, for example, metal or polysilicon.

The transistor 933 may include a gate electrode 935, gate dielectric 937 and spacer 939, coupled as can be seen. The gate electrode 935, gate dielectric 937 and/or spacer 939 may wrap around at least the active nanowire (e.g., nanowire 904a) and may wrap around both nanowires 904a, 905a (or more nanowires if present) in some embodiments. An electrically insulative material 922 may be deposited on the electrically insulative material 934 to provide electrical insulation between the transistor 933 and electrodes 904b, 905b. The electrically insulative material 922 may include a dielectric such as, for example silicon oxide or silicon nitride. Heat generated in transistor 933 and associated channel (e.g., nanowire 904a) may be transferred through electrodes 905b and/or through electrically insulative material 930, which may provide thermal coupling between the channel (e.g., nanowire 904a) and TEC element (e.g., nanowire 905a).

In some embodiments, the TEC circuitry described herein may be further configured to recover electrical energy (e.g., power) from a current generated by heat in the second circuitry. For example, if a high transistor temperature can be tolerated from a reliability perspective, a strong local temperature gradient may be maintained between a source and drain when the transistor is at or near a saturation state. A complement of the Peltier effect is the Seebeck effect, where temperature differences can be converted directly into electricity. For example, a thermal gradient across an open-circuited conductor can result in a voltage across it depending on the Seebeck coefficient. Based on principles similar to what is described in connection with TEC device 300 of FIG. 3, a local Seebeck effect may cause hot electrons or holes to flow towards a colder end and produce an electrical current. Such electrical current can be used to enhance performance of the heat-generating circuitry or TEC circuitry or may be collected (e.g., via parallel ground through semiconductor substrate or interconnect path) to a power delivery network that provides power for the die. The current, for example, may be collected by capacitors such as, for example, embedded capacitors in the die or capacitors on a package substrate or other component of an IC assembly (e.g., IC assembly 200 of FIG. 2). The charge may be collected over time to power additional circuitry of the die. A control module or circuit may be implemented to balance regeneration need against input power needed to sustain operation of TEC circuitry. Embodiments of the techniques and configurations described in connection with FIGS. 3-9 may be suitably combined according to various embodiments. The electrically insulative materials, electrically conductive materials and semiconductor materials (e.g., including nanowire materials) described herein may include a wide variety of other suitable well-known materials in other embodiments.

Figure 10:
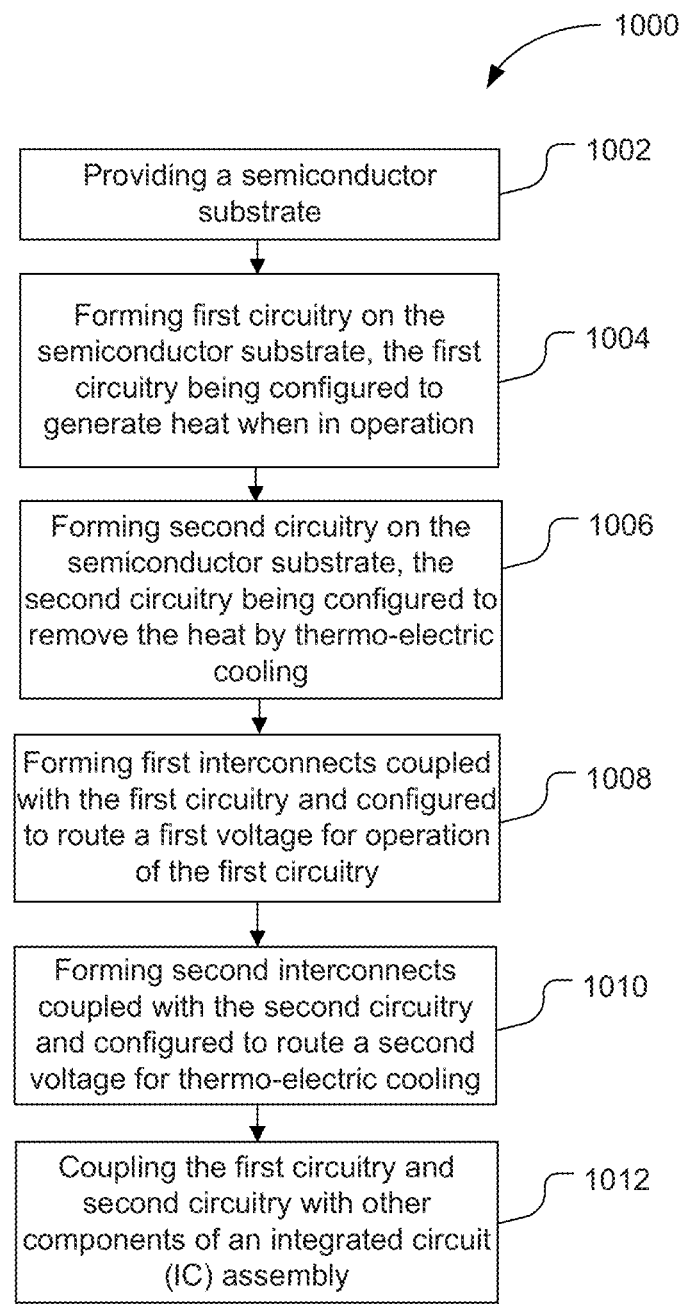
FIG. 10 schematically illustrates a flow diagram for a method of fabricating TEC circuitry, in accordance with some embodiments.

FIG. 10 schematically illustrates a flow diagram for a method 1000 of fabricating TEC circuitry (e.g., an IC cooling assembly), in accordance with some embodiments. The method 1000 may comport with embodiments described in connection with FIGS. 1-9 and vice versa.

At 1002, the method 1000 may include providing a semiconductor substrate (e.g., semiconductor substrate 420 described herein). In some embodiments, the semiconductor substrate may include a substrate of a system-on-chip (SoC) configuration. For example, the vertically stacked nanowire configuration 900 of FIG. 9 may facilitate integration of the TEC circuitry with 3D stacked devices with multiple device layers or 3D interconnect where device self-heat may be more confined by lack of access to bulk silicon. With TEC circuitry, thermal management may be part of the design of the die. Through optimization of layout and control, space on the die may be utilized that may be traditionally limited to accommodate local hot spots. Integration of TEC circuitry with the heat-generating circuitry may provide fine control of cooling to localized hot spots on the die, which may further increase an ability to mitigate and defend against malicious attacks that rely on self-heat of devices on the die to cause reliability problems or failure by overheating.

At 1004, the method 1000 may include forming first circuitry (e.g., heat-generating circuitry described herein) on the semiconductor substrate, the first circuitry being configured to generate heat when in operation. The operation of the first circuitry may include, for example, access and/or switching of the transistors. In some embodiments, forming the first circuitry may include forming a first fin structure or first nanowire that is configured to serve as a channel of one or more transistor devices. The first fin structure or first nanowire may be disposed in a horizontal plane that is substantially parallel with a plane defined by a surface (e.g., surface 420a of FIG. 4) of the semiconductor substrate.

At 1006, the method 1000 may include forming second circuitry (e.g., TEC circuitry described herein) on the semiconductor substrate, the second circuitry being configured to remove the heat by thermo-electric cooling. In some embodiments, forming the second circuitry may include forming a second fin structure or second nanowire that is disposed in the horizontal plane and thermally coupled with the first fin structure or first nanowire. According to various embodiments, forming the first circuitry and forming the second circuitry may be simultaneously performed. For example, semiconductor fabrication processes used to form the first circuitry may be used to also form the second circuitry such that the second circuitry is integrally formed with the first circuitry. In some embodiments, the first fin structure or first nanowire and the second fin structure or second nanowire may each extend in a common lengthwise direction.

In some embodiments, the first circuitry and the second circuitry may be configured to remove the heat in the lengthwise direction. In other embodiments, forming the first circuitry may comprise forming a first fin structure that extends in a vertical direction that is substantially perpendicular to a lengthwise direction of the first fin structure to define a first height, h1, of the first fin and forming the second circuitry may comprise forming a second fin structure such that the second fin structure extends in the vertical direction to define a second height, h2, of the second fin. The height h1 may be greater than h2 and the second fin may be configured to remove the heat in the vertical direction.

In yet other embodiments, forming the first circuitry may include forming one or more transistor devices and forming the second circuitry may include forming thermal routing structures that are thermally coupled with the one or more transistor devices. The thermal routing structures may include components of a TEC device that are disposed between the one or more transistor devices and the semiconductor substrate to remove heat in away from the one or more transistor devices towards the semiconductor substrate.

In one embodiment, forming the second circuitry may provide second circuitry that is further configured to recover power from a current generated by heat in the second circuitry. For example, capacitors or analogous structures may be used to store or route electrical energy generated by a Seebeck effect of the second circuitry.

At 1008, the method 1000 may include forming first interconnects coupled with the first circuitry and configured to route a first voltage for operation of the first circuitry. The first interconnects may include, for example, interconnect structures such as, for example, trenches and/or vias disposed in interconnect layers that are formed on the first circuitry to electrically couple the first circuitry with a power source external to the die. The first interconnects may further include, for example, pads, die-level interconnect structures such as first-level interconnects (FLIs) and/or package-level interconnect structures such as second-level interconnects (SLIs) that route electrical signals (e.g., the first voltage) to the first circuitry.

At 1010, the method 1000 may include forming second interconnects coupled with the second circuitry and configured to route a second voltage for thermo-electric cooling. The second interconnects may be formed using similar techniques as described in connection with forming the first interconnects at 1008. The second voltage may under separate control from the first voltage and/or may be coupled with a different voltage source than the first voltage. In some embodiments, the first interconnects include electrical routing features of a power delivery network and the second interconnects include other electrical routing features of the power delivery network. The electrical features corresponding with the first interconnects and second interconnects may be disposed on various components of an IC assembly including, for example, the die, the package substrate or a circuit board.

At 1012, the method 1000 may include coupling the first circuitry and second circuitry with other components of an integrated circuit (IC) assembly. In some embodiments, the first circuitry and the second circuitry may be coupled with other components of the IC assembly using well-known techniques to couple a die with corresponding electrical connections for the first circuitry and second circuitry to a package substrate. For example, the die may be mounted on the package substrate in a flip-chip or wirebonding configuration or embedded in the package substrate or the die may be coupled with a package-on-package (PoP) assembly. The package substrate may be further coupled with a circuit board to further route electrical connections for the first circuitry and/or second circuitry.

Figure 11:
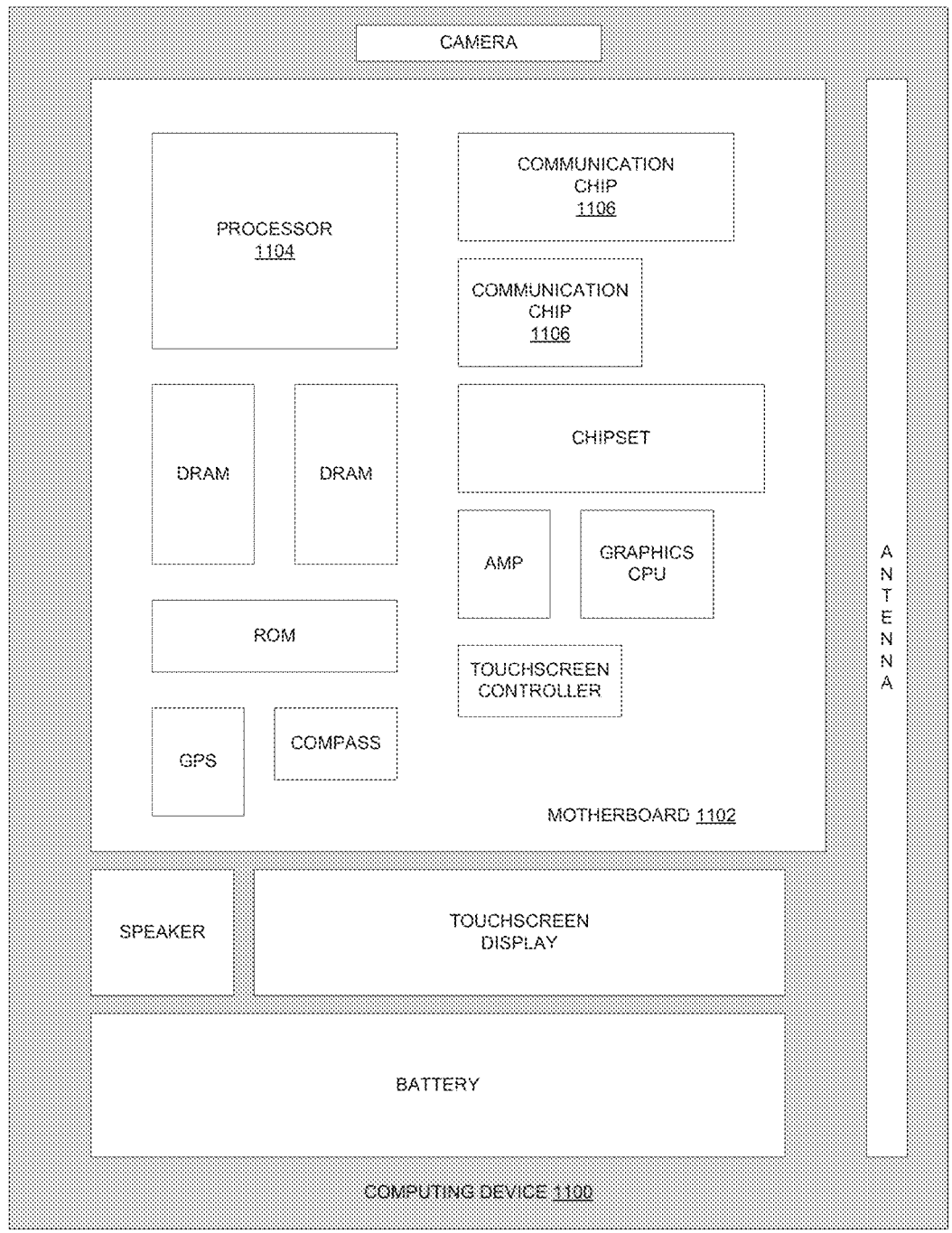
FIG. 11 schematically illustrates an example system that may include TEC circuitry as described herein, in accordance with some embodiments.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 11 schematically illustrates an example system (e.g., computing device 1100) that may include TEC circuitry as described herein, in accordance with some embodiments. The computing device 1100 may house a board such as motherboard 1102. The motherboard 1102 may include a number of components, including but not limited to a processor 1104 and at least one communication chip 1106. The processor 1104 may be physically and electrically coupled to the motherboard 1102. In some implementations, the at least one communication chip 1106 may also be physically and electrically coupled to the motherboard 1102. In further implementations, the communication chip 1106 may be part of the processor 1104.

Depending on its applications, computing device 1100 may include other components that may or may not be physically and electrically coupled to the motherboard 1102. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1106 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1106 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1106 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1106 may operate in accordance with other wireless protocols in other embodiments.

The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 may include a die (e.g., die 102 of FIGS. 1-2) having heat-generating circuitry and TEC circuitry as described herein. For example, the die 102 of FIGS. 1-2 may be mounted in a package assembly that is mounted on the motherboard 1102. The term "processor" may refer to any device or portion of a device that processes electronic data from registers and/or memory to transform that electronic data into other electronic data that may be stored in registers and/or memory.

The communication chip 1106 may also include a die (e.g., die 102 of FIGS. 1-2) having heat-generating circuitry and TEC circuitry as described herein. In further implementations, another component (e.g., memory device or other integrated circuit device) housed within the computing device 1100 may contain a die (e.g., die 102 of FIGS. 1-2) having heat-generating circuitry and TEC circuitry as described herein.

In various implementations, the computing device 1100 may be a mobile computing device, laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

EXAMPLES

According to various embodiment, the present disclosure describes an apparatus (e.g., integrated circuit (IC) cooling assembly), comprising a semiconductor substrate, first circuitry disposed on the semiconductor substrate and configured to generate heat when in operation and second circuitry disposed on the semiconductor substrate and configured to remove the heat by thermoelectric cooling. In some embodiments, the first circuitry comprises a first fin structure that is configured to serve as a channel of one or more transistor devices, the first fin structure is disposed in a horizontal plane that is substantially parallel with a plane defined by a surface of the semiconductor substrate and the second circuitry comprises a second fin structure that is disposed in the horizontal plane and thermally coupled with the first fin structure. In some embodiments, the first fin structure extends in a lengthwise direction, the second fin structure extends in the lengthwise direction such that the second fin structure is substantially parallel with the first fin structure and the second fin structure is configured to remove the heat in the lengthwise direction.

In some embodiments, the apparatus further includes a source contact or drain contact, the source contact or the drain contact being thermally coupled with the first fin structure and the second fin structure, wherein the first fin structure is one of n-type or p-type, the second fin structure is p-type if the first fin structure is n-type, and the second fin structure is n-type if the first fin structure is p-type. In some embodiments, the first fin structure extends in a vertical direction that is substantially perpendicular to the lengthwise direction to define a first height of the first fin, the second fin structure extends in the vertical direction to define a second height of the second fin, the second height is greater than the first height and the second fin is configured to remove the heat in a direction that is parallel with the vertical direction. In some embodiments, the first circuitry includes one or more transistor devices and the second circuitry includes thermal routing structures thermally coupled with the one or more transistor devices and disposed between the one or more transistor devices and the semiconductor substrate.

In some embodiments, the second circuitry includes a nanowire. In some embodiments, the nanowire is a second nanowire and the first circuitry includes a first nanowire that is thermally coupled with the second nanowire and the first nanowire is part of a transistor device. In some embodiments, the first circuitry is configured to operate using a first voltage of a first voltage source and the second circuitry is configured to remove the heat by thermoelectric cooling using a second voltage of a second voltage source, the first voltage source being different than the second voltage source. In some embodiments, the apparatus further includes a first interconnect coupled with the first circuitry and configured to route the first voltage for operation of the first circuitry and a second interconnect coupled with the second circuitry and configured to route the second voltage for thermoelectric cooling. In some embodiments, the second circuitry is further configured to recover power from a current generated by heat in the second circuitry and the semiconductor substrate is a substrate of a system-on-chip (SoC).

According to various embodiments, the present disclosure describes a method of fabricating a cooling assembly, the method comprising providing a semiconductor substrate, forming first circuitry on the semiconductor substrate, the first circuitry being configured to generate heat when in operation and forming second circuitry on the semiconductor substrate, the second circuitry being configured to remove the heat by thermoelectric cooling. In some embodiments, forming the first circuitry comprises forming a first fin structure that is configured to serve as a channel of one or more transistor devices and is disposed in a horizontal plane that is substantially parallel with a plane defined by a surface of the semiconductor substrate and forming the second circuitry comprises forming a second fin structure that is disposed in the horizontal plane and thermally coupled with the first fin structure. In some embodiments, forming the first fin structure and forming the second structure are simultaneously performed, the first fin structure and the second fin structure each extend in a lengthwise direction that is substantially parallel to one another and the second fin structure is configured to remove the heat in the lengthwise direction.

In some embodiments, the method further includes forming a source contact or drain contact, the source contact or the drain contact being thermally coupled with the first fin structure and the second fin structure. In some embodiments, forming the first fin structure comprises forming the first fin structure such that the first fin structure extends in a vertical direction that is substantially perpendicular to the lengthwise direction to define a first height of the first fin and forming the second fin structure comprises forming the second fin structure such that the second fin structure extends in the vertical direction to define a second height of the second fin, wherein the second height is greater than the first height and the second fin is configured to remove the heat in a direction that is parallel with the vertical direction. In some embodiments, forming the first circuitry includes forming one or more transistor devices and forming the second circuitry includes forming thermal routing structures thermally coupled with the one or more transistor devices, wherein the thermal routing structures are disposed between the one or more transistor devices and the semiconductor substrate.

In some embodiments, forming the second circuitry includes forming a nanowire. In some embodiments, the nanowire is a second nanowire and forming the first circuitry includes forming a first nanowire that is thermally coupled with the second nanowire and is part of a transistor device. In some embodiments, the method further includes forming a first interconnect coupled with the first circuitry and configured to route a first voltage for operation of the first circuitry and forming a second interconnect coupled with the second circuitry and configured to route a second voltage for thermoelectric cooling.

In some embodiments, forming the second circuitry provides second circuitry that is further configured to recover power from a current generated by heat in the second circuitry. In some embodiments, providing the semiconductor substrate comprises providing the semiconductor substrate of a system-on-chip (SoC).

According to various embodiments, the present disclosure describes a system (e.g., a computing device) comprising a circuit board and a die coupled with the circuit board, the die including a semiconductor substrate, first circuitry disposed on the semiconductor substrate and configured to generate heat when in operation and second circuitry disposed on the semiconductor substrate and configured to remove the heat by thermoelectric cooling, wherein the first circuitry is configured to operate using a first voltage of a first voltage source and the second circuitry is configured to remove the heat by thermoelectric cooling using a second voltage of a second voltage source, the first voltage source being different than the second voltage source. In some embodiments, the system further includes a package substrate coupled with the circuit board, wherein the die is mounted on or embedded in the package substrate and wherein the package substrate or the circuit board includes a power delivery network that includes first electrical routing features to route the first voltage to the first circuitry and second electrical routing features to route the second voltage to the second circuitry. In some embodiments, the system is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) cooling assembly, comprising:
    a semiconductor substrate;
    first circuitry that includes a transistor with a channel area on the semiconductor substrate in a first layer directly coupled to the substrate, wherein the transistor is to generate heat when in operation; and
    second circuitry on the semiconductor substrate in the first layer, wherein the second circuitry is to remove the heat by thermoelectric cooling, and wherein the second circuitry includes:
        a fin structure
        wherein the fin structure is located in the first layer directly coupled to the semiconductor substrate, and wherein the fin structure is separated from the channel area of the transistor of the first circuitry by an electrically insulative and thermally conductive material, wherein the fin structure and the channel area of the transistor contain a same semiconductor material.

2. The assembly of claim 1, wherein:
    the transistor of the first circuitry is a first transistor, and the first circuitry includes one or more additional transistor devices; and
    the second circuitry includes additional thermal routing structures thermally coupled with the one or more additional transistor devices and between the one or more additional transistor devices and the semiconductor substrate.

3. The assembly of claim 1, wherein the first circuitry is to operate using a first voltage of a first voltage source and the second circuitry is to remove the heat by thermoelectric cooling using a second voltage of a second voltage source, wherein the first voltage is different from the second voltage.

4. The assembly of claim 3, further comprising:
    a first interconnect coupled with the first circuitry, wherein the first interconnect is to route the first voltage for operation of the first circuitry; and
    a second interconnect coupled with the second circuitry, wherein the second interconnect is to route the second voltage for thermoelectric cooling.

5. The assembly of claim 1, wherein:
    the second circuitry is further to recover power from a current generated by heat in the second circuitry; and
    the semiconductor substrate is a substrate of a system-on-chip (SoC).

6. The assembly of claim 1, wherein the first circuitry comprises a first fin structure to serve as the channel area of the transistor.

7. The assembly of claim 6, wherein the second circuitry comprises a second fin structure thermally coupled with the first fin structure.

8. The assembly of claim 1, wherein the second circuitry comprises the fin structure.

9. An integrated circuit (IC) cooling assembly, comprising:
    a semiconductor substrate;
    first circuitry that includes a transistor with a channel area on the semiconductor substrate in a first layer, wherein the transistor is to generate heat when in operation; and
    second circuitry on the semiconductor substrate, wherein the second circuitry is to remove the heat by thermoelectric cooling, and wherein the second circuitry includes:
        a nanowire, wherein the nanowire is located in a second layer separated from the channel area of the transistor of the first circuitry by an electrically insulative and thermally conductive material; and
        an electrically insulative material disposed above the semiconductor substrate to encapsulate the nanowire and the channel area of the transistor of the first circuitry.

10. The IC cooling assembly of claim 9, wherein:
    the nanowire is a second nanowire; and
    the first circuitry includes a first nanowire that is thermally coupled with the second nanowire; and
    the first nanowire is part of the transistor.

11. The IC cooling assembly of claim 9, wherein:
    the transistor of the first circuitry is a first transistor, and the first circuitry includes one or more additional transistor devices; and
    the second circuitry includes additional thermal routing structures thermally coupled with the one or more additional transistor devices and between the one or more additional transistor devices and the semiconductor substrate.

12. The IC cooling assembly of claim 9, wherein the first circuitry is to operate using a first voltage of a first voltage source and the second circuitry is to remove the heat by thermoelectric cooling using a second voltage of a second voltage source, wherein the first voltage is different from the second voltage.

13. The IC cooling assembly of claim 12, further comprising:
    a first interconnect coupled with the first circuitry, wherein the first interconnect is to route the first voltage for operation of the first circuitry; and
    a second interconnect coupled with the second circuitry, wherein the second interconnect is to route the second voltage for thermoelectric cooling.

14. The IC cooling assembly of claim 9, wherein:
    the second circuitry is further to recover power from a current generated by heat in the second circuitry; and
    the semiconductor substrate is a substrate of a system-on-chip (SoC).

* * * * *